US009496455B2

(12) United States Patent
Park et al.

(10) Patent No.: US 9,496,455 B2
(45) Date of Patent: Nov. 15, 2016

(54) UV LIGHT EMITTING DIODE AND METHOD OF FABRICATING THE SAME

(71) Applicant: Seoul Viosys Co., Ltd., Ansan-si (KR)

(72) Inventors: Ki Yon Park, Ansan-si (KR); Jeong Hun Heo, Ansan-si (KR); Hwa Mok Kim, Ansan-si (KR); Gun Woo Han, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

(21) Appl. No.: 14/810,464

(22) Filed: Jul. 27, 2015

(65) Prior Publication Data
US 2016/0027964 A1 Jan. 28, 2016

(30) Foreign Application Priority Data

Jul. 25, 2014 (KR) .................. 10-2014-0094958

(51) Int. Cl.
H01L 33/00 (2010.01)
H01L 33/06 (2010.01)
H01L 33/32 (2010.01)
(52) U.S. Cl.
CPC ............ *H01L 33/06* (2013.01); *H01L 33/007* (2013.01); *H01L 33/32* (2013.01)

(58) Field of Classification Search
CPC ...... H01L 33/00; H01L 33/06; H01L 33/007; H01L 33/0025; H01L 33/32; H01L 33/50; H01L 33/58; H01L 33/504; H01L 33/48; H01L 33/60; H01L 33/62; H01L 33/36; H01L 33/483; H01L 33/644; H01L 33/64
USPC .......................... 257/13, 76, 81, 89, 98, 99
See application file for complete search history.

(56) References Cited

U.S. PATENT DOCUMENTS

2015/0171271 A1* 6/2015 Inoue .................. H01L 33/38
257/98
2015/0228862 A1* 8/2015 Miyoshi ............. H01L 33/0079
257/98

* cited by examiner

Primary Examiner — Chuong A Luu
(74) Attorney, Agent, or Firm — Perkins Coie LLP

(57) ABSTRACT

Exemplary embodiments provide a UV light emitting diode and a method of fabricating the same. The method of fabricating a UV light emitting diode includes growing a first n-type semiconductor layer including AlGaN, wherein growth of the first n-type semiconductor layer includes changing a growth pressure within a growth chamber and changing a flow rate of an n-type dopant source introduced into the growth chamber. A pressure change during growth of the first n-type semiconductor layer includes at least one cycle of a pressure increasing period and a pressure decreasing period over time, and change in flow rate of the n-type dopant source includes increasing the flow rate of the n-type dopant source in the form of at least one pulse. The UV light emitting diode fabricated by the method has excellent crystallinity.

15 Claims, 12 Drawing Sheets (a)

(b)

(a)

(b)

(a)

(b)

UV LIGHT EMITTING DIODE AND METHOD OF FABRICATING THE SAME

PRIORITY CLAIMS AND CROSS-REFERENCE TO RELATED APPLICATION

This patent document claims priority and benefits of Korean Patent Application No. 10-2014-0094958, filed on Jul. 25, 2014, the contents of which are incorporated by reference herein in its entirety.

TECHNICAL FIELD

The disclosure of this patent document relates to a UV light emitting diode and a method of fabricating the same. Some implementations of the disclosed technology permit separation of a growth substrate in fabrication of the UV light emitting diode and include semiconductor layers having excellent crystallinity.

BACKGROUND

Light emitting diodes refer to inorganic semiconductor devices that emit light generated by recombination of electrons and holes. Particularly, ultraviolet (UV) light emitting diodes have been increasingly used in a variety of fields such as UV curing, sterilization, white light sources, medicines, equipment parts, and the like.

UV light emitting diodes emit light having a relatively short peak wavelength (generally, light having a peak wavelength of 400 nm or less). In fabrication of such UV light emitting diodes, an active layer is formed of a material having band gap energy corresponding to a relatively short peak wavelength in order to emit light of the relatively short peak wavelength. For example, the active layer can be formed of AlGaN containing 10% or more of Al as a nitride semiconductor. In addition, if the band gap energy of n-type and p-type nitride semiconductor layers is lower than energy of UV light emitted from the active layer, the UV light emitted from the active layer can be absorbed into the n-type and p-type nitride semiconductor layers in the light emitting diode. Accordingly, not only the active layer of the UV light emitting diode but also other semiconductor layers disposed in a light emitting direction of the light emitting diode are formed to have an Al content of 10% or more.

SUMMARY

Exemplary embodiments provide a UV light emitting diode that includes semiconductor layers having excellent crystallinity, and a method of fabricating the same.

In one aspect, a method of fabricating a UV light emitting diode is provided to include: forming an n-type semiconductor layer on a growth substrate within a growth chamber; and forming an active layer and a p-type semiconductor layer on the n-type semiconductor layer, wherein the forming the n-type semiconductor layer includes growing a first n-type semiconductor layer including AlGaN, the growing the first n-type semiconductor layer includes changing a growth pressure within the growth chamber and changing a flow rate of an n-type dopant source introduced into the growth chamber, the changing the growth pressure during growth of the first n-type semiconductor layer includes performing at least one cycle of a pressure increasing period and a pressure decreasing period, and the changing the flow rate of the n-type dopant source includes increasing the flow rate of the n-type dopant source in a pulse form.

Accordingly, a method of fabricating a UV light emitting diode having excellent crystallinity and improved luminous efficacy can be provided.

In some implementations, the growing the first n-type semiconductor layer can include growing an $Al_xGa_{(1-x)}N$ layer (0<x<1) in the pressure increasing period and growing an $Al_yGa_{(1-y)}N$ layer (0<y<1) in the pressure decreasing period, and x gradually decreases in a direction away from the growth substrate, and y gradually increases in the direction away from the growth substrate.

In some implementations, the changing the growth pressure during growth of the first n-type semiconductor layer includes at least two cycles of the pressure increasing period and the pressure decreasing period.

In some implementations, the changing the flow rate of the n-type dopant source can include supplying the n-type dopant source at a first flow rate during the pressure decreasing period and supplying the n-type dopant source at a second flow rate higher than the first flow rate during the pressure increasing period, and wherein the changing the flow rate of the n-type dopant source includes supplying the n-type dopant source in a pulse form.

In some implementations, the changing the flow rate of the n-type dopant source includes supplying the n-type dopant source in a square waveform.

In some implementations, the changing the growth pressure during growth of the first n-type semiconductor layer forms a triangular waveform or a harmonic waveform.

In some implementations, the forming the n-type semiconductor layer further includes maintaining flow rates and growth temperature of Al, Ga and N sources within the growth chamber as constant.

In some implementations, the fabrication method can further include, before the forming the n-type semiconductor layer: forming a GaN layer; forming an AlN layer on the GaN layer, wherein the forming the AlN layer can include supplying an Al source and the N source at constant flow rates into the growth chamber and changing pressure of the growth chamber from a first pressure to a second pressure and vice versa. Here, the first pressure can be different from the second pressure.

In some implementations, the fabrication method can further include forming an undoped nitride layer before forming the n-type semiconductor layer.

In some implementations, the forming the undoped nitride layer can include alternately stacking an $Al_wGa_{(1-w)}N$ layer (0<w<1) grown at a first pressure and an $Al_zGa_{(1-z)}N$ layer (0<z<1) grown at a second pressure, wherein the first pressure can be different from the second pressure.

In some implementations, the forming the undoped nitride layer can include changing a growth pressure within the growth chamber over time, and the changing of the growth pressure during growth of the undoped nitride layer can include performing at least one cycle including a pressure increasing period and a pressure decreasing period.

In some implementations, the forming the n-type semiconductor layer can further include forming at least one of a second n-type semiconductor layer and a third n-type nitride semiconductor layer over a lower surface and an upper surface of the first n-type semiconductor layer, respectively.

In some implementations, the forming the second n-type semiconductor layer, the third n-type semiconductor layer, or both includes changing the flow rate of the n-type dopant source introduced into the growth chamber, and the changing the flow rate of the n-type dopant source can include increasing the flow rate of the n-type dopant source in a pulse form.

In some implementations, the changing the growth pressure during the growth of the first n-type semiconductor layer can further include maintaining the growth pressure at a constant level during at least one pressure maintaining period.

In some implementations, the forming the AlN layer grown at the first pressure can have a different Al mole fraction than the AlN layer includes forming the AlN layer having varying Al mole fractions depending on pressure condition under which the AlN layer is formed.

In another aspect, a UV light emitting diode is provided to include: a support substrate; a p-type semiconductor layer disposed over the support substrate; an active layer disposed over the p-type semiconductor layer; and an n-type semiconductor layer disposed over the active layer, wherein the n-type semiconductor layer includes a first n-type semiconductor layer including at least a portion having band gap energy continuously changing in a thickness direction of the first n-type semiconductor layer.

In some implementations, the first n-type semiconductor layer can have a stack structure including an $Al_xGa_{(1-x)}N$ layer (0<x<1) and an $Al_yGa_{(1-y)}N$ layer (0<y<1), wherein x gradually decreases in a direction away from the growth substrate and y gradually increases in the direction away from the growth substrate.

In some implementations, the n-type semiconductor layer can further include a second n-type semiconductor layer disposed over a lower surface of the first n-type semiconductor layer, a third n-type nitride layer disposed over an upper surface of the first n-type semiconductor layer, or both second and third n-type nitride layers disposed over the lower and upper surfaces respectively.

In some implementations, the second n-type semiconductor layer, the third n-type nitride layer, or each of the second and third n-type semiconductor layers can have a stack structure including an $A_uGa_{(1-u)}N$ layer (0<u<1) with a first n-type-doping impurity concentration and an $A_vGa_{(1-v)}N$ layer (0<v<1) with a second n-type-doping impurity concentration, and the first n-type doping impurity concentration is higher than the second n-type doping impurity concentration.

In some implementations, the first n-type semiconductor layer can include a region that has constant band gap energy in a thickness direction of the first n-type semiconductor.

Embodiments of the disclosure provide a method of fabricating a UV light emitting diode, which can improve crystallinity of the UV light emitting diode through a relatively simple and easy process. In addition, embodiments of the disclosure provide a UV light emitting diode, from which a growth substrate is removed, thereby providing excellent luminous efficacy. Further, some implementations of the UV light emitting diode can prevent damage due to stress within semiconductor layers, thereby providing improved reliability.

DETAILED DESCRIPTION

Figure 1:
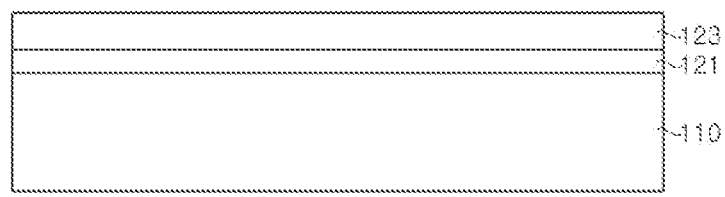
FIG. 1 to FIG. 10 are sectional views and diagrams illustrating an exemplary method of fabricating a light emitting diode and an exemplary light emitting diode fabricated according to some embodiments of the disclosure.

Hereinafter, embodiments of the present disclosure will be described in detail with reference to the accompanying drawings. The following embodiments are provided by way of example so as to facilitate the understanding of various implementations of the disclosed technology. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Composition ratios, growth methods, growth conditions, thicknesses, and the like disclosed in the following descriptions are provided as examples, and other implementations are also possible. For example, for AlGaN, various composition ratios of Al and Ga can be used depending on the need of a person having ordinary knowledge in the art ("those skilled in the art"). Furthermore, semiconductor layers disclosed hereinafter can be grown by various methods such as Metal Organic Chemical Vapor Deposition (MOCVD), Molecular Beam Epitaxy (MBE), Hydride Vapor Phase Epitaxy (HVPE), or the like. In the following exemplary embodiments, semiconductor layers are grown in the same chamber by MOCVD, and conventional sources with predetermined composition ratios can be used and introduced into the chamber. For example, a Ga source can include TMGa, or TEGa, and the like; an Al source can include TMA, or TEA, and the like; an In source can include TMI, or TEI, and the like; and an N source can include $NH_3$. However, such compositions are provided as examples only and other implementations are also possible.

In fabrication of UV light emitting diodes, a sapphire substrate is used as an exemplary growth substrate. When an $Al_xGa_{(1-x)}N$ layer (0.1≤x≤1) is grown on the sapphire substrate, cracking or breaking occurs due to thermal or structural deformation resulting from a high Al content. This problem results from lattice mismatch and/or a difference in coefficient of thermal expansion between the sapphire substrate and the $Al_xGa_{(1-x)}N$ layer (0.1≤x≤1). In the related art, in order to minimize occurrence of such problems, a light emitting diode is fabricated by forming an AlN layer at high temperature on the sapphire substrate or forming an AlN/AlGaN superlattice layer on the sapphire substrate, followed by forming an n-type semiconductor layer including an $Al_xGa_{(1-x)}N$ (0.2≤x≤1), an active layer, and a p-type semiconductor layer. For example, U.S. Pat. No. 7,192,849 B2 and the like disclose a structure including an AlInGaN superlattice layer using a precursor flux pulse.

However, U.S. Pat. No. 7,192,849 B2 and the like disclose only adjustment of a flow of an atomic source gas with a pulse in the method of growing the AlInGaN superlattice layer. When the superlattice layer is grown through adjustment of only the flow of the atomic source gas, other remaining atomic source gases can deteriorate reproducibility thereof, and make it difficult to form a superlattice layer having an intended composition.

Moreover, for a UV light emitting diode including an AlN layer grown on a sapphire substrate, it is difficult to separate the growth substrate from the semiconductor layers. Generally, when the sapphire substrate is used as the growth substrate, the growth substrate is separated from the semiconductor layers using a laser lift-off process. However, excimer laser beams generally used in the laser lift-off process have a longer wavelength than the band gap energy of AlN or a substantially similar wavelength thereto. For example, a KrF excimer laser beam has a wavelength of 248 nm, which passes through an AlN layer, and thus cannot be used for laser lift-off. In addition, an ArF excimer laser beam has a wavelength of 193 nm and can be absorbed into the AlN layer. However, since there is not much difference between the wavelength of the ArF excimer laser beam and a wavelength (about 200 nm) corresponding to the band gap energy of the AlN layer, some of the ArF excimer laser beam can pass through the AlN layer or the AlN/AlGaN superlattice layer. Moreover, the ArF excimer laser cannot provide enough energy to separate the growth substrate due to low pulse energy thereof.

Therefore, a typical UV light emitting diode has been provided as a lateral type light emitting diode or a flip-chip type light emitting diode including a growth substrate. The lateral type or flip-chip type light emitting diode includes a partially removed active layer, exhibits poor heat dissipation, and has low efficiency.

Moreover, since $Al_xGa_{(1-x)}N$ ($0.1 \leq x \leq 1$) is difficult to grow with good crystallinity as compared with GaN, the fabricated light emitting diode has low internal quantum efficiency. Generally, it is known in the art that an $Al_xGa_{(1-x)}N$ ($0.1 \leq x \leq 1$) layer grown at a high temperature of 1200° C. or more by metal organic chemical vapor deposition (MOCVD) has improved crystallinity. However, when operated at a high temperature of 1200° C. or more, a conventional MOCVD apparatus can suffer from reduction in lifespan, and it is difficult to achieve stable growth of $Al_xGa_{(1-x)}N$ ($0.1 \leq x \leq 1$). Therefore, it is difficult to achieve mass production of UV light emitting diodes having good crystallinity and high internal quantum efficiency using the conventional MOCVD apparatus.

FIG. 1 to FIG. 9 are sectional views and diagrams illustrating an exemplary method of fabricating a light emitting diode and an exemplary light emitting diode fabricated according to some embodiments of the disclosure.

Referring to FIG. 1, a GaN layer 123 is formed on a growth substrate 110. In some implementations, a buffer layer 121 can also be formed on the growth substrate 110 before formation of the GaN layer 123.

The growth substrate 110 can be any substrate capable of growing nitride semiconductor layers without limitation, and can include, for example, a sapphire substrate, silicon carbide substrate, a spinel substrate, or a nitride substrate such as a GaN substrate or an AlN substrate. As an example, in this embodiment, the growth substrate 110 can be or include a sapphire substrate.

The GaN layer 123 can be grown to a thickness of about 3 μm or less, for example, about 1 μm, on the growth substrate 110. The GaN layer 123 can be grown at a temperature of about 900° C. to about 1100° C. and a pressure of about 200 Torr within the growth chamber. By forming the GaN layer 123 on the growth substrate 110, it is possible to employ laser lift-off in a process for separating the growth substrate 110 described below.

Before growth of the GaN layer 123, the buffer layer 121 can be grown to a thickness of about 25 nm or less on the growth substrate 110 at a temperature of about 600° C. and a pressure of 600 Torr. In some implementations, when the growth substrate 110 is a sapphire substrate, the buffer layer 121 can act as a nucleus layer so as to allow growth of other semiconductor layers thereon, and relieve stress due to lattice mismatch between the sapphire substrate and other semiconductor layers described below. The buffer layer 121 can be omitted, as needed.

Figure 2:
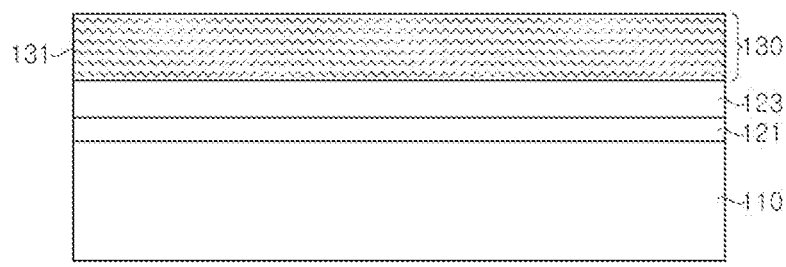

Referring to FIG. 2, an n-type semiconductor layer 130 including a first n-type semiconductor layer 131 is formed.

The first n-type semiconductor layer 131 can be grown on the GaN layer 123 within the growth chamber. In addition, the first n-type semiconductor layer 131 can include an $Al_xGa_{(1-x)}N$ layer ($0<x<1$, x being not constant) and an $Al_yGa_{(1-y)}N$ layer ($0<y<1$, y being not constant), and can be doped to become an n-type semiconductor layer with n-type impurities such as Si.

Growth of the first n-type semiconductor layer 131 includes introducing an Al source, a GaN source and an N source into the growth chamber, in which growth temperature can be set in the range of about 900° C. to about 1100° C. During growth of the first n-type semiconductor layer 131, a flow rate of each of the Al source, the GaN source and the N source can be kept constant and the growth temperature can also be generally kept constant within allowable tolerance.

Furthermore, the growth process of the first n-type semiconductor layer 131 can include changing a pressure condition within the growth chamber, and the changing of the pressure within the growth chamber during growth of the first n-type semiconductor layer 131 can include time periods including a pressure increasing period and a pressure decreasing period. During the growth of the first n-type semiconductor layer 131, at least one cycle of pressure increase and pressure decrease processes can be performed. Further, the growth process of the first n-type semiconductor layer 131 can include supplying the n-type dopant source into the growth chamber in the form of multiple pulses.

In this embodiment, the first n-type semiconductor layer 131 can be grown by changing the pressure and the flow rate of the n-type dopant source without changing other growth conditions.

Next, growth of the first n-type semiconductor layer 131 will be described in more detail with reference to FIGS. 3a to 4b.

Figure 3A:
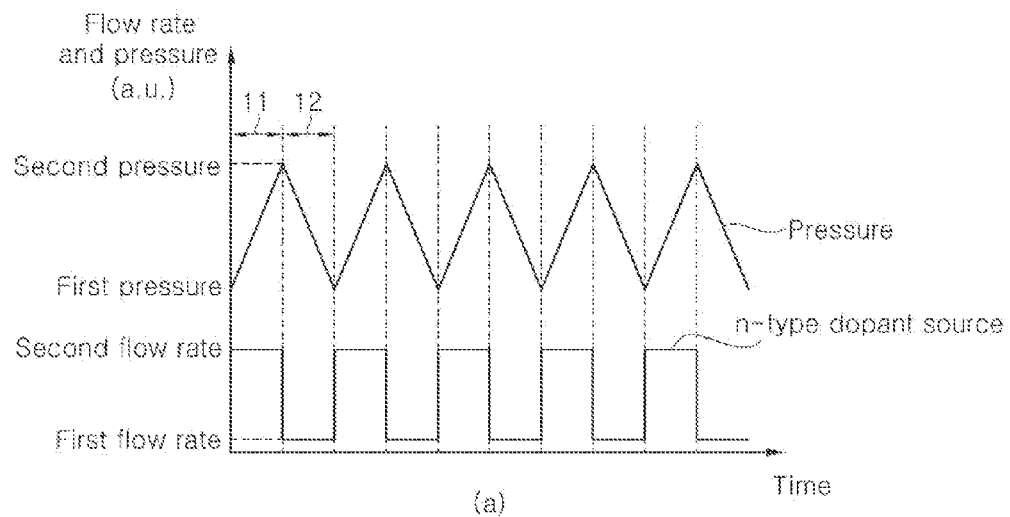

First, referring to FIG. 3a, during growth of the first n-type semiconductor layer 131, the pressure within the chamber can be continuously changed, and, as shown therein, the pressure change within the chamber can include a cycle of a pressure increasing period 11 in which the pressure is increased from a first pressure to a second pressure and a pressure decreasing period 12 in which the pressure is decreased from the second pressure to the first pressure. The cycle of the pressure increasing period 11 and the pressure decreasing period 12 can be repeated at least twice, and the pressure change over time can have a triangular waveform. The first pressure is lower than the second pressure. In some implementations, the first pressure can be between 0 and 100 Torr, and the second pressure can be between 0 and 300 Torr.

In the pressure increasing period 11, the $Al_xGa_{(1-x)}N$ layer (0<x<1, x being not constant) can be grown and in the pressure decreasing period 12, the $Al_yGa_{(1-y)}N$ layer (0<y<1, y being not constant) can be grown. For example, as in this embodiment, when the pressure change over time has a triangular waveform in the course of growing the first n-type semiconductor layer 131, the first n-type semiconductor layer 131 can have a repeated stack structure of $Al_xGa_{(1-x)}N$ layers and $Al_yGa_{(1-y)}N$ layers, and the repeated stack structure can be or include a superlattice structure.

When only the pressure is changed while keeping other growth conditions constant, the composition ratio of the AlGaN layer to be grown is also changed. As the pressure increases, the Al content of the AlGaN layer to be grown is decreased. As such, since the Al content of the $Al_xGa_{(1-x)}N$ layer (0<x<1, x being not constant) is decreased during growth of the $Al_xGa_{(1-x)}N$ layer in the pressure increasing period 11, the Al content of the $Al_xGa_{(1-x)}N$ layer is gradually decreased in an upward direction from the growth substrate 110. On the contrary, since the Al content of the $Al_yGa_{(1-y)}N$ layer (0<y<1, y being not constant) is increased during growth of the $Al_yGa_{(1-y)}N$ layer in the pressure decreasing period 12, the Al content of the $Al_yGa_{(1-y)}N$ layer is gradually increased in the upward direction from the growth substrate 110.

The reason that the Al content of the AlGaN layer is changed depending upon the pressure within the growth chamber will be described hereinafter. For example, when TMGa, TMA and $NH_3$ are used as Al, Ga and N sources, respectively, these sources react to form AlGaN crystals within the growth chamber while $CH_4$ is discharged. However, sometimes, these sources can fail to form the AlGaN crystals during crystal growth of AlGaN and can be discharged outside the growth chamber instead of reacting in the form of $TMGa-NH_3$ ($Ga(CH_3)—NH_3$) or $TMA-NH_3$ polymer ($Al(CH_3)—NH_3$). At this time, when the pressure within the growth chamber is relatively decreased, the formation ratio of the polymer is decreased and the ratio of source molecules contributing to formation of crystals to source molecules of each of the source gases introduced into the growth chamber increases. Since Al exhibits a stronger inclination towards $CH_3$ ligand than Ga, the formation ratio of the polymer becomes sensitive to the pressure within the growth chamber. That is, even in the same state where pressure decreases, the formation ratio and loss ratio of the polymer of Al become lower than the formation ratio and loss ratio of the polymer of Ga, thereby increasing an Al mole fraction as compared with Ga during the formation of the AlGaN layer. Accordingly, the Al content of the AlGaN layer increases with decreasing pressure under the same growth conditions excluding the pressure.

When the pressure changes in a triangular waveform as in this embodiment, the Al content of the $Al_xGa_{(1-x)}N$ layer and the $Al_yGa_{(1-y)}N$ layer can change substantially linearly. However, it should be understood that the present disclosure is not limited thereto and other implementations are also possible. The pressure change can occur as shown in FIG. 3b, 4a, or 4b.

Figure 3B:
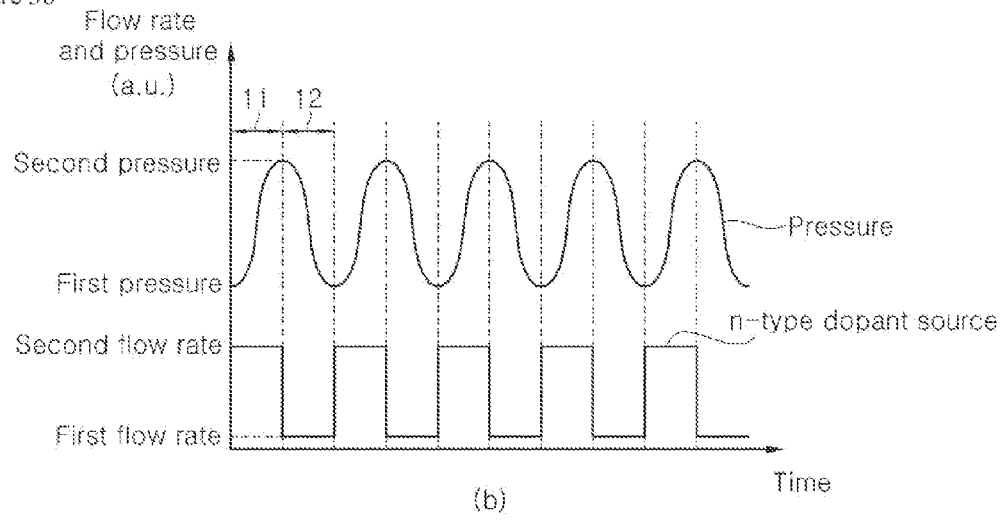

As shown in FIG. 3b, the pressure changes like a harmonic waveform. In this case, the Al content of the $Al_xGa_{(1-x)}N$ layer and the $Al_yGa_{(1-y)}N$ layer can exhibit non-linear variation with the pressure change.

Figure 4A:
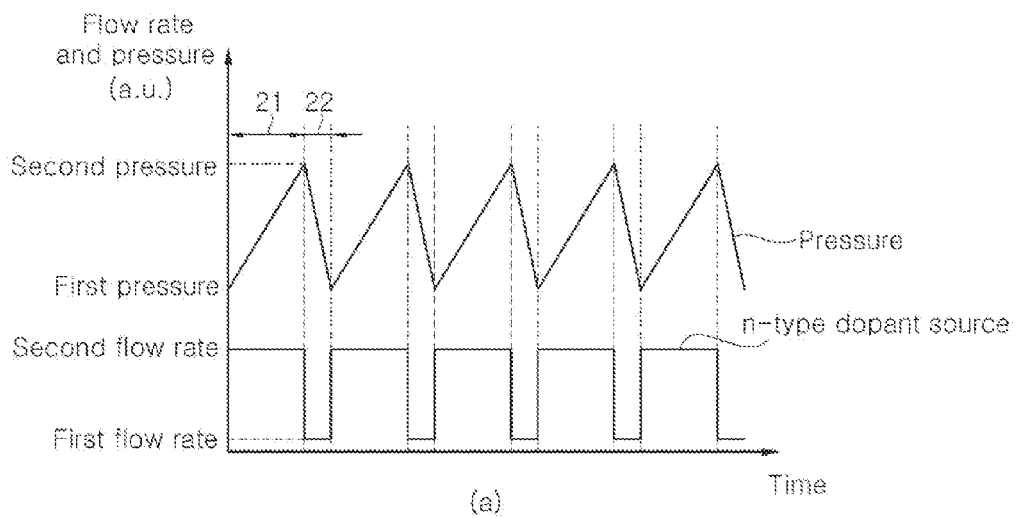

Furthermore, as shown in FIG. 4a, in the pressure change, the pressure increasing period 21 and the pressure decreasing period 22 can be asymmetrical to each other. For example, duration of the pressure increasing period 21 can be set to be longer than that of the pressure decreasing period 22, whereby the $Al_xGa_{(1-x)}N$ layer can have a higher thickness than the $Al_yGa_{(1-y)}N$ layer. Further, the change rate of the Al content in the $Al_xGa_{(1-x)}N$ layer according to the thickness thereof can be lower than that of the Al content in the $Al_yGa_{(1-y)}N$ layer according to the thickness thereof.

Figure 4B:
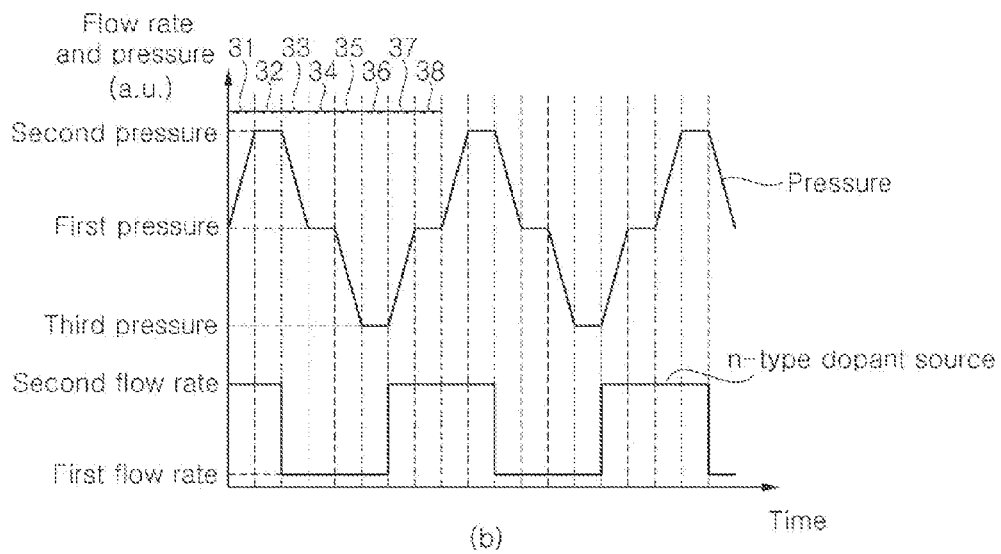

Furthermore, as shown in FIG. 4b, in the pressure increasing period and the pressure decreasing period, the pressure can be kept constant for a predetermined period of time. For example, in a first zone 31, the pressure of the growth chamber is increased from a first pressure to a second pressure over time, and in a second zone 32, the pressure of the growth chamber is maintained at the second pressure for a predetermined period of time. Then, in a third zone 33, the pressure of the growth chamber is decreased to the first pressure over time; in a fourth zone 34, the pressure of the growth chamber is maintained at the first pressure for a predetermined period of time; and in a fifth zone 35, the pressure of the growth chamber is decreased to a third pressure over time. Then, in a sixth zone 36, the pressure of the growth chamber is maintained at the third pressure for a predetermined period of time; in a seventh zone 37, the pressure of the growth chamber is increased from the third pressure to the first pressure over time; and in an eighth zone 38, the pressure of the growth chamber is maintained at the first pressure for a predetermined period of time. During growth of the first n-type semiconductor layer 131, the pressure within the growth chamber changes by including at least one cycle of the pressure increasing period and the pressure decreasing period over time. In some implementations, the pressure within the growth chamber changes to further include at least one pressure maintaining period.

Referring back to FIG. 3a, the growth process of the first n-type semiconductor layer 131 includes changing the flow rate of the n-type dopant source introduced into the growth chamber, and changing the flow rate of the n-type dopant source can include increasing the flow rate of the n-type dopant source in the form of at least one pulse. For example, as shown therein, in the pressure increasing period 11, the n-type dopant source can be introduced at a second flow rate into the growth chamber, and in the pressure decreasing period 12, the n-type dopant source can be introduced at a first flow rate into the growth chamber. The first flow rate can be lower than the second flow rate. When the cycle of the pressure increasing period 11 and the pressure decreasing period 12 is repeated in a triangular waveform as in this embodiment, the n-type dopant source can be introduced into the growth chamber in a multiple-waveform corresponding to the pressure change. Each of the multiple-waveform can have a certain period of time, and, for example, as shown in FIG. 3a, the flow rate of the n-type dopant source can be provided in a square waveform.

The first and second flow rates can be adjusted according to doping concentrations of the $Al_xGa_{(1-x)}N$ layer and the $Al_yGa_{(1-y)}N$ layer, respectively. For example, the first flow rate is set to allow the $Al_yGa_{(1-y)}N$ layer to be grown in a substantially undoped state or in a low doping concentration, and the second flow rate is set to allow the $Al_xGa_{(1-x)}N$ layer to be grown at a relatively high doping concentration. Here, the $Al_xGa_{(1-x)}N$ layer can have an n-type dopant concentration of about $1 \times 10^{18}$ to about $1 \times 10^{19}/cm^3$.

In some implementations, the n-type dopant source can be asymmetrically supplied, as shown in FIG. 4a.

According to this embodiment, the first n-type semiconductor layer 131 can include a high doped $Al_xGa_{(1-x)}N$ layer and a low doped or undoped $Al_yGa_{(1-y)}N$ layer, wherein x gradually decreases in a direction away from the growth substrate 110 and y gradually increases in the direction away from the growth substrate 110.

In the first n-type semiconductor layer 131, the $Al_xGa_{(1-x)}N$ layer (0<x<1) and the $Al_yGa_{(1-y)}N$ layer (0<y<1) can have different growth rates due to a difference in growth pressure. With this structure, it is possible to block propagation of a dislocation or change a propagation route of the dislocation, thereby reducing dislocation density of other semiconductor layers grown in subsequent processes. Furthermore, since the compositions of the $Al_xGa_{(1-x)}N$ layer (0<x<1) and the $Al_yGa_{(1-y)}N$ layer (0<y<1) are changed, stress caused by lattice mismatch can be relieved, thereby securing excellent crystallinity of other semiconductor layers grown in subsequent processes while preventing damage such as cracks and the like.

Furthermore, since the pressure and flow rates of other element sources except the n-type dopant source, and temperature are kept constant during growth of the $Al_xGa_{(1-x)}N$ layer (0<x<1) and the $Al_yGa_{(1-z)}N$ layer (0<y<1), it is possible to provide an n-type semiconductor layer having superior crystallinity to semiconductor layers in the art without performing an additional process. In addition, since the pressure change is continuously and consecutively performed during growth of the first n-type semiconductor layer 131, the process is simple and easy to improve reliability of the process, as compared with the case where the pressure change is performed in a pulse form. Furthermore, since a waiting time required for the pressure of the growth chamber to reach a target pressure can be omitted, it is possible to reduce a growth time of the n-type semiconductor layer 130, as compared with the case where the pressure change is performed in a pulse form.

Furthermore, in the first n-type semiconductor layer 131, a high impurity concentration layer and a low impurity concentration layer are alternately repeated to suppress deterioration in crystallinity of the semiconductor layers due to impurities.

However, it should be understood that the present disclosure is not limited to the method of growing the first n-type semiconductor layer 131 described above. The pressure change includes the pressure increasing period and the pressure decreasing period, which can be irregular. In addition, the n-type dopant source can also be supplied in a pulse form, which can also be irregular.

According to the method described above, the first n-type semiconductor layer 131 includes the $Al_xGa_{(1-x)}N$ layer (0<x<1) and the $Al_yGa_{(1-z)}N$ layer (0<y<1), wherein the Al content of each of the $Al_xGa_{(1-x)}N$ layer (0<x<1) and the $Al_yGa_{(1-z)}N$ layer (0<y<1) is continuously changed in the thickness direction of the first n-type semiconductor layer 131. In some implementations, Al content s of the $Al_xGa_{(1-x)}N$ layer (0<x<1) and the $Al_yGa_{(1-z)}N$ layer (0<y<1) are continuously and spatially changed from one surface of the first n-type semiconductor layer 131 to the other surface of the first n-type semiconductor layer 131. Accordingly, the first n-type semiconductor layer 131 can have band gap energy continuously changing in the thickness direction in some region thereof. For example, FIGS. 23a, 23b, 24a, and 24b show band gap energy of each of first n-type semiconductor layers 131 in the thickness direction thereof, in which the first n-type semiconductor layers 131 were formed under growth conditions of FIGS. 3a, 3b, 4a and 4b. In FIGS. 23a, 23b, 24a and 24b, each of reference numerals including 'a' denote the band gap energy of an AlGaN layer grown in each time zone in FIGS. 3a, 3b, 4a and 4b. For example, in FIG. 3a, the band gap energy of the AlGaN layer grown in the pressure increasing period 11 corresponds to section 11a in FIG. 23a.

Figure 5:
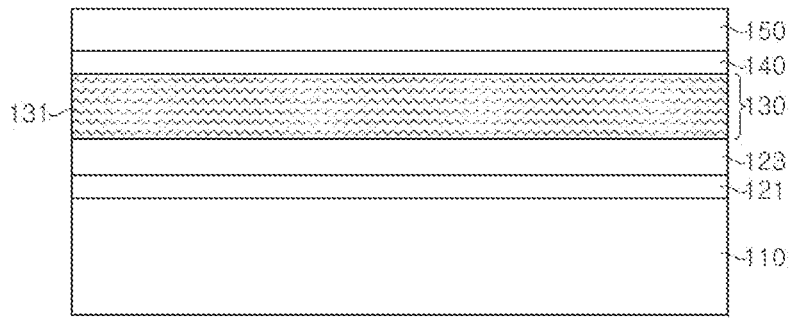

Next, referring to FIG. 5, an active layer 140 and a p-type semiconductor layer 150 are formed on the n-type semiconductor layer 130.

The active layer 140 can include (Al, Ga, In)N and can emit light having a peak wavelength in a desired UV region through adjustment of the composition ratio of the nitride semiconductor. The active layer 140 can be formed in a multi-quantum well (MQW) structure wherein barrier layers (not shown) and well layers (not shown) are alternately stacked one above another. For example, the active layer 140 can be formed by growing a quaternary nitride semiconductor such as AlInGaN to form the barrier layers and the well layers at a temperature of about 700° C. to about 1000° C. and a pressure of about 100 Torr to about 400 Torr.

In addition, among the barrier layers, a barrier layer closest to the n-type semiconductor layer 130 can have a higher Al content than other barrier layers. The structure wherein the barrier layer closest to the n-type semiconductor layer 130 is formed to have a higher Al content than other barrier layers can effectively prevent overflow of electrons by reducing electron mobility. Further, barrier layers disposed near the n-type semiconductor layer can have a greater thickness than some other barrier layers, and the uppermost barrier layer can have a greater thickness or a higher Al content than some other barrier layers. For example, the first and second barrier layers can have a greater thickness than the third barrier layer, and the uppermost barrier layer can have a greater thickness than the third barrier layer.

The p-type semiconductor layer 150 can be grown on the active layer 140 and can be formed to a thickness of about 0.2 μm or less at a temperature of about 900° C. to about 1000° C. and a pressure of about 100 Torr to about 400 Torr. The p-type semiconductor layer 150 can include a nitride semiconductor such as AlGaN, and can be doped to become a p-type semiconductor layer by including p-type impurities such as Mg.

Furthermore, the p-type semiconductor layer 150 can further include a delta doping layer (not shown) to reduce ohmic contact resistance and can further include an electron blocking layer (not shown).

The electron blocking layer can include an AlGaN layer. In addition, the electron blocking layer can include a first electron blocking layer (not shown) and a second electron blocking layer (not shown) disposed on the first electron blocking layer, wherein the first electron blocking layer can have a higher Al content than the second electron blocking layer.

Figure 6:
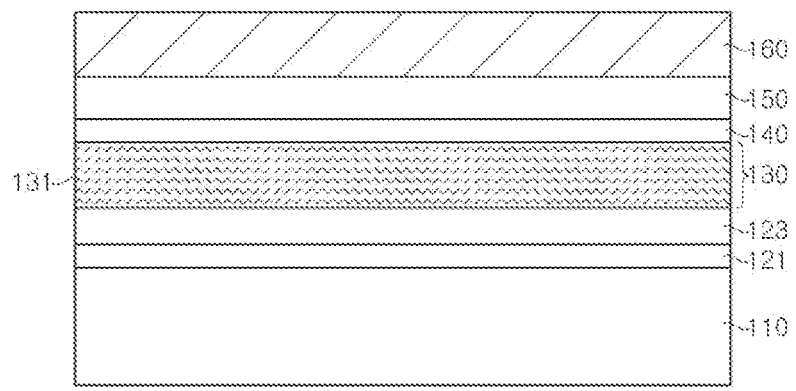

Next, referring to FIG. 6, a support substrate 160 is formed on the p-type semiconductor layer 150.

The support substrate 160 can be or include an insulating substrate, a conductive substrate, or a circuit substrate. For example, the support substrate 160 can be or include a sapphire substrate, a gallium nitride substrate, a glass substrate, a silicon carbide substrate, a silicon substrate, a metallic substrate, or a ceramic substrate. In addition, the support substrate 160 can be bonded to the p-type semiconductor layer 150. Thus, a bonding layer (not shown) can be further formed between the support substrate 160 and the p-type semiconductor layer 150 to bond them each other.

The bonding layer can include a metallic material, for example, AuSn. The bonding layer containing AuSn can realize eutectic bonding between the support substrate 160 and the p-type semiconductor layer 150. When the support substrate 160 is a conductive substrate, the bonding layer electrically connects the p-type semiconductor layer 150 to the support substrate 160.

Furthermore, a metal layer (not shown) can be formed between the support substrate 160 and the p-type semiconductor layer 150.

The metal layer can include a reflective metal layer (not shown) and a barrier metal layer (not shown) which can be formed to cover the reflective metal layer.

The reflective metal layer can be formed through deposition and lift-off. The reflective metal layer serves to reflect light and can act as an electrode electrically connected to the p-type semiconductor layer 150. Thus, the reflective metal layer preferably includes a material that has high reflectivity with respect to UV light and is capable of forming ohmic contact. The reflective metal layer can include, for example, at least one of Ni, Pt, Pd, Rh, W, Ti, Al, Ag or Au.

The barrier metal layer prevents interdiffusion between the reflective metal layer and other materials. Accordingly, it is possible to prevent increase in contact resistance and reduction in reflectivity due to damage of the reflective metal layer. The barrier metal layer can include Ni, Cr, or Ti, and can be formed in multiple layers.

Figure 7:
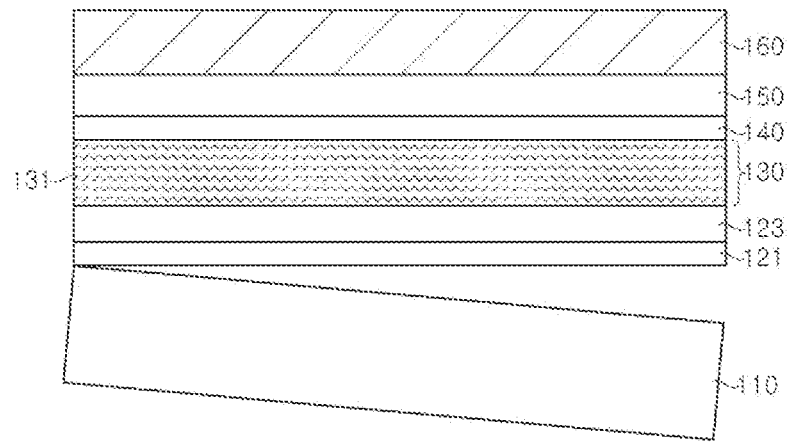

Referring to FIG. 7, the growth substrate 110 is separated from the semiconductor layers. In some implementations, the growth substrate 110 can be separated from the GaN layer 123. The growth substrate 110 can be separated by various methods such as laser lift-off, chemical lift-off, stress lift-off, or thermal lift-off, and the like.

For example, when the growth substrate 110 is or includes a sapphire substrate, the growth substrate can be separated from the semiconductor layers by laser lift-off. According to this embodiment, since the GaN layer 123 can be formed between the n-type semiconductor layer 130 and the growth substrate 110, the growth substrate 110 can be easily separated from the semiconductor layer using a KrF excimer laser. Accordingly, it is possible to resolve difficulty in separation of the growth substrate using laser lift-off in fabrication of a UV light emitting diode in the related art.

Here, it should be understood that the present disclosure is not limited thereto and other implementations are also possible. For example, additional layers, for example, a sacrificial layer, can be formed between the growth substrate 110 and the semiconductor layers, and the growth substrate 110 can be separated from the semiconductor layers by chemical lift-off or stress lift-off.

Figure 8:
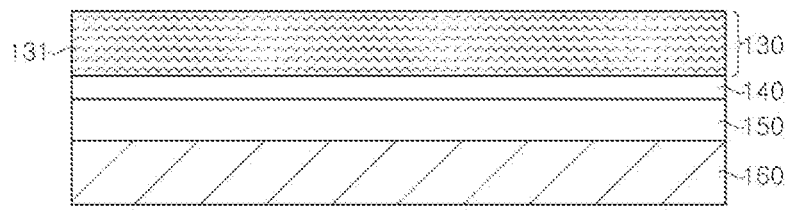

Referring to FIG. 8, after separation of the growth substrate 110, other semiconductor layers (for example, residues of the GaN layer 123 and/or the buffer layer 121) remaining on the n-type semiconductor layer 130 are removed to expose one surface of the n-type semiconductor layer 130. In order to expose one surface of the n-type semiconductor layer 130, the residues on an upper surface of the n-type semiconductor layer 130 can be removed by a chemical and/or physical process, or etching, and the like.

Further, in order to increase roughness of the exposed surface of the n-type semiconductor layer 130, the method can further include forming roughness (not shown) on the surface of the n-type semiconductor layer 130. The roughness can be formed by wet etching and the like. For example, the roughness can be formed by photo-enhanced chemical (PEC) etching, or etching using a sulfuric/phosphoric acid solution, and the like. The roughness can be determined in various ways depending upon etching conditions and can have an average height of, for example, 0.5 µm or less. The roughness can enhance light extraction efficiency of the UV light emitting diode according to the present disclosure.

Figure 9:
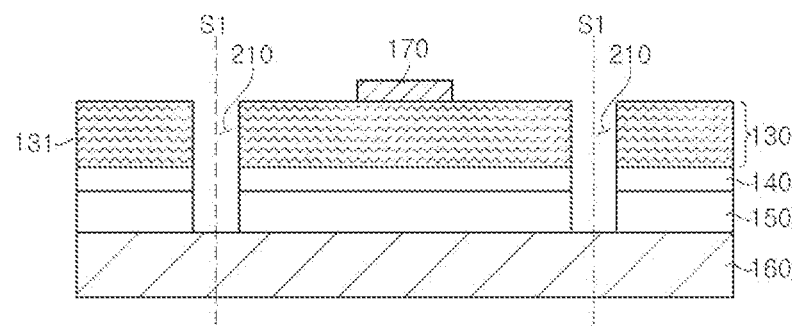

Referring to FIG. 9, device isolation trenches 210 can be formed by patterning the n-type semiconductor layer 130, the active layer 140 and the p-type semiconductor layer 150. By forming the device isolation trenches 210, an upper surface of the support substrate 160 can be partially exposed. In addition, an N-electrode 170 can be formed on each of device areas isolated from each other by the device isolation trench 210.

The N-electrode 170 can be formed in a region disposed below the surface of the n-type AlGaN layer in order to improve ohmic characteristics of the AlGaN layer having a high Al content. For example, the N-electrode 170 can be formed on a groove formed on the upper surface of the n-type semiconductor layer 130. With this structure, a contact area between the N-electrode 170 and the n-type semiconductor layer 130 is increased, to improve current injection characteristics.

Patterning of the n-type semiconductor layer 130, the active layer 140 and the p-type semiconductor layer 150 can be performed by photolithography and etching, and the device isolation trenches 210 can be formed to have inclined side surfaces.

The N-electrode 170 can serve to supply external power to the n-type semiconductor layer 130 and can be formed by deposition and lift-off.

Figure 10:
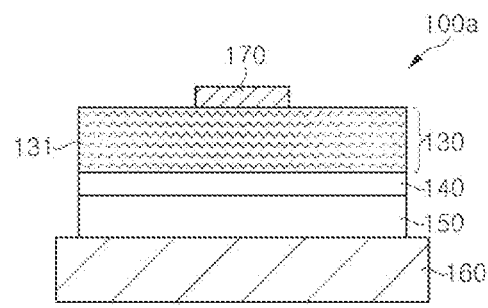

Thereafter, the support substrate 160 disposed under each of the device isolation trenches 210 is divided along line S1, to provide a UV light emitting diode 100a as shown in FIG. 10.

Figure 11:
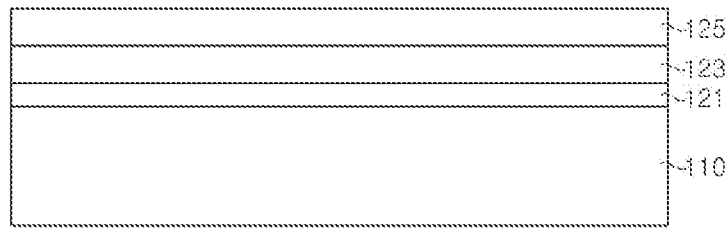
FIG. 11 and FIG. 12 are sectional views illustrating an exemplary method of fabricating a light emitting diode and an exemplary light emitting diode fabricated according to some embodiments of the disclosure.
Figure 12:
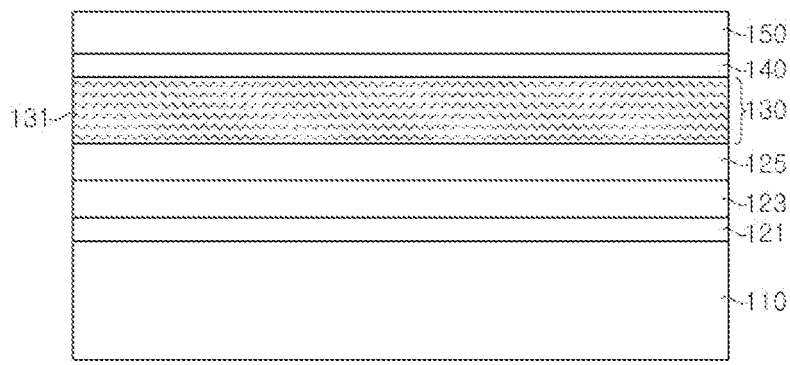

FIG. 11 and FIG. 12 are sectional views illustrating an exemplary method of fabricating a light emitting diode according to some embodiments of the disclosure and a light emitting diode fabricated thereby. The light emitting diode fabricated by the method according to the embodiment shown in FIG. 11 and FIG. 12 is generally similar to that of the embodiment shown in FIG. 1 to FIG. 10, and further includes an AlN layer 125 between the n-type semiconductor layer 130 and the GaN layer 123. In the following description, different features of this embodiment will be mainly described.

Referring to FIG. 11, the AlN layer 125 can be formed on the GaN layer 123 before formation of the n-type semiconductor layer 130.

Formation of the AlN layer 125 can include alternately growing an AlN layer at a third pressure and an AlN layer at a fourth pressure at a temperature of about 900° C. to about 1100° C. to form a stack structure. Each of the Al layers alternately stacked one above another can have a thickness of about 5 nm, whereby the stack structure can have a superlattice layer structure. Here, the third pressure can be different from the fourth pressure, and can be lower than the fourth pressure. For example, the third pressure can be between 0 and 100 Torr, and the fourth pressure can be between 0 and 400 Torr.

The AlN layer 125 grown at the third pressure and the AlN layer grown at the fourth pressure can have different growth rates due to a pressure difference. With this structure, it is possible to block propagation of dislocation or to change a propagation route thereof, thereby reducing dislocation density of other semiconductor layers grown in subsequent processes.

In the AlN layer 125, an Al mole fraction varies depending upon the pressure at which the AlN layer 125 is grown. When the growth pressure of the growth chamber increases during growth of the AlN layer, there is a high possibility that Al sites become vacancies in an AlN crystal or are redisposed with other impurities. Thus, the AlN layer grown at the third pressure has a lower possibility of vacancy formation or replacement of the Al sites with impurities than the AlN layer grown at the fourth pressure. Accordingly, the AlN layer grown at the third pressure can have a higher Al mole fraction than the AlN layer grown at the fourth pressure.

Next, referring to FIG. 12, the n-type semiconductor layer 130, the active layer 140 and the p-type semiconductor layer 150 are formed on the AlN layer 125.

Then, subsequent processes substantially similar to those described with reference to FIG. 6 to FIG. 10 are performed, thereby providing a light emitting diode 100a as shown in FIG. 10. However, in this embodiment, the AlN layer 125 remaining on the n-type semiconductor layer 130 after separation of the growth substrate 110 can be removed by various methods.

Figure 13:
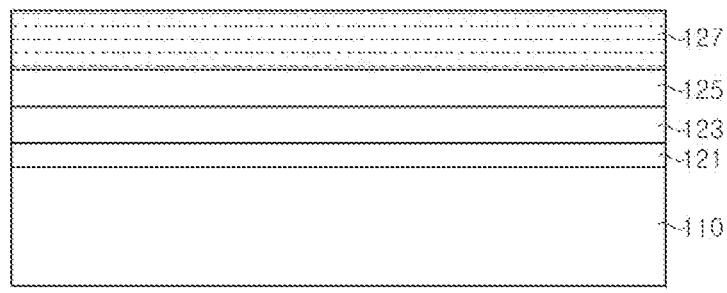
FIG. 13 and FIG. 14 are sectional views illustrating an exemplary method of fabricating a light emitting diode and an exemplary light emitting diode fabricated according to some embodiments of the disclosure.
Figure 14:
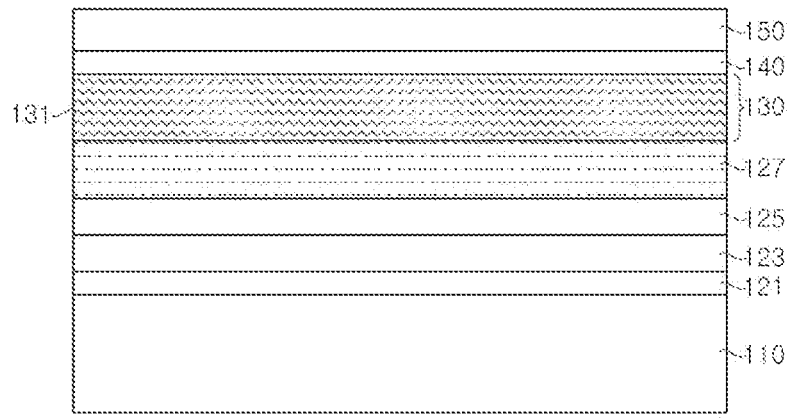

FIG. 13 and FIG. 14 are sectional views illustrating an exemplary method of fabricating a light emitting diode according to some embodiments of the disclosure and a light emitting diode fabricated thereby.

The light emitting diode fabricated by the method according to the embodiment shown in FIG. 13 and FIG. 14 is generally similar to that of the embodiment shown in FIG. 11 and FIG. 12, and further includes an undoped nitride layer 127 on the AlN layer 125. In the following description, different features of this embodiment will be mainly described.

The undoped nitride layer 127 can be formed on the AlN layer 125 before formation of the n-type semiconductor layer 130. Formation of the undoped nitride layer 127 can include alternately stacking an $Al_wGa_{(1-w)}N$ layer (0<w<1) grown at a fifth pressure and an $Al_zGa_{(1-z)}N$ layer (0<z<1) grown at a sixth pressure to form a stack structure. The stack structure can have a superlattice layer structure. The $Al_wGa_{(1-w)}N$ layers (0<w<1) and the $Al_zGa_{(1-z)}N$ layers (0<z<1) alternately stacked one above another can be formed to thicknesses of about 5 nm and about 10 nm, respectively, at a temperature of about 900° C. to 1100° C. Accordingly, a superlattice layer structure including the $Al_wGa_{(1-w)}N$ layers (0<w<1) and the $Al_zGa_{(1-z)}N$ layers (0<z<1) can be formed.

Here, the fifth pressure can be different from the sixth pressure, and can be lower than the sixth pressure. For example, the fifth pressure can be greater than 0 to 100 Torr, and the sixth pressure can be greater than 0 to 300 Torr. With the different growth pressures, the $Al_wGa_{(1-w)}N$ layer (0<w<1) and the $Al_zGa_{(1-z)}N$ layer (0<z<1) can be formed to have different composition ratios or the same composition ratio. For example, under the same growth conditions excluding the pressure, the AlGaN layer grown at a lower pressure can have a higher Al content than the AlGaN layer grown at a higher pressure.

Alternatively, the pressure change during growth of the undoped nitride layer 127 can be similar to the pressure change during growth of the first n-type semiconductor layer 131. That is, the pressure change during growth of the undoped nitride layer 127 can include a cycle of a pressure increasing period and a pressure decreasing period, in which the Al content of the undoped nitride layer 127 can be similarly changed to the Al content of the first n-type semiconductor layer 131.

The $Al_wGa_{(1-w)}N$ layer (0<w<1) and the $Al_zGa_{(1-z)}N$ layer (0<z<1) can have different growth rates due to a difference in growth pressure. With this structure, it is possible to block propagation of dislocation or to change a propagation route thereof, thereby reducing dislocation density of other semiconductor layers grown in subsequent processes. Furthermore, when the $Al_wGa_{(1-w)}N$ layer (0<w<1) and the $Al_zGa_{(1-z)}N$ layer (0<y<1) are formed to have different composition ratios, stress caused by lattice mismatch can be relieved, thereby securing excellent crystallinity of the other semiconductor layers grown in subsequent processes while preventing damage such as cracks and the like.

Next, referring to FIG. 14, the n-type semiconductor layer 130, the active layer 140 and the p-type semiconductor layer 150 are formed on the undoped nitride layer 127.

Then, subsequent processes substantially similar to those described with reference to FIG. 6 to FIG. 10 are performed, thereby providing a light emitting diode 100a as shown in FIG. 10. However, in this embodiment, the AlN layer 125 and the undoped nitride layer 127 remaining on the n-type semiconductor layer 130 after separation of the growth substrate 110 can be removed by various methods.

In this embodiment, the AlN layer 125 can be omitted. In this case, the undoped nitride layer 127 can be grown on the GaN layer 123.

FIG. 15 to FIG. 22 are sectional views illustrating an exemplary method of fabricating a light emitting diode according to some embodiments of the disclosure and a light emitting diode fabricated thereby.

The fabrication method according to the embodiment shown in FIG. 15 to FIG. 22 is generally similar to that of the embodiment shown in FIG. 11 and FIG. 12, and is different from the above embodiment in that growing the n-type semiconductor layer 130 includes forming a second n-type semiconductor layer 133 and/or a third n-type nitride layer 135. In the following description, different features of this embodiment will be mainly described and descriptions of the same feature will be omitted.

Figure 15:
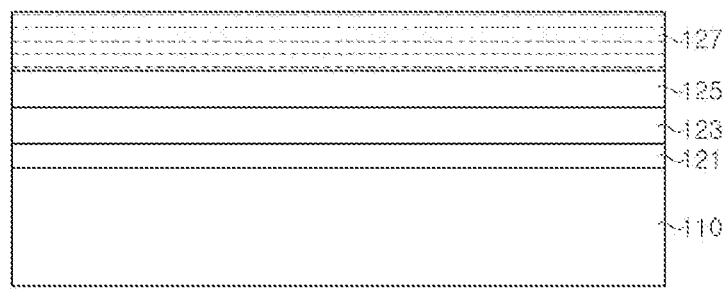
FIG. 15 to FIG. 22 are sectional views illustrating an exemplary method of fabricating a light emitting diode and an exemplary light emitting diode fabricated according to some embodiments of the disclosure.

Referring to FIG. 15, a template as shown in FIG. 13 is prepared. For example, a buffer layer 121, a GaN layer 123, an AlN layer 125 and an undoped nitride layer 127 are grown on a growth substrate 110. Here, as described above, the buffer layer 121, the GaN layer 123, the AlN layer 125 and the undoped nitride layer 127 can also be omitted.

Figure 16:
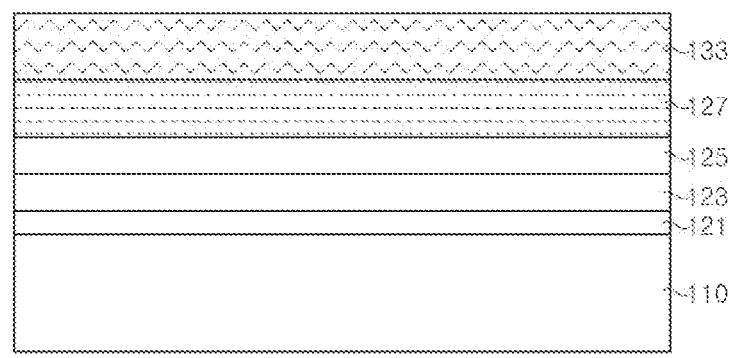
Figure 17:
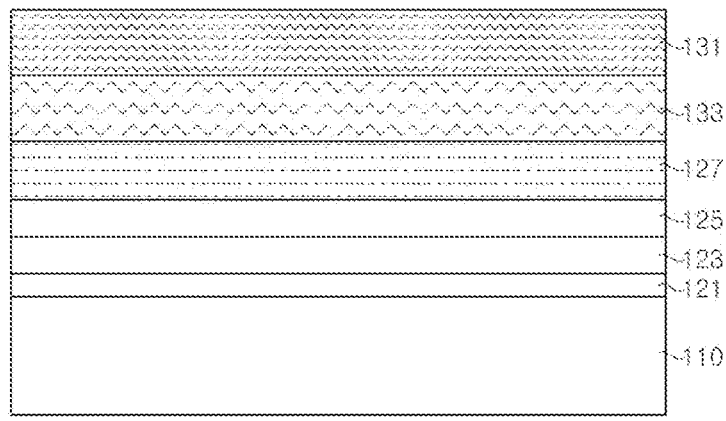

Then, referring to FIG. 16, a second n-type semiconductor layer 133 can be formed on the undoped nitride layer 127.

The second n-type semiconductor layer 133 can be grown on the undoped nitride layer 127 within the growth chamber. In addition, the second n-type semiconductor layer 133 can include an $Al_uGa_{(1-u)}N$ layer (0<u<1) and an $Al_vGa_{(1-v)}N$ layer (0<v<1), and can be doped to become an n-type semiconductor layer with n-type impurities such as Si. Here, the $Al_uGa_{(1-u)}N$ layer (0<u<1) and the $Al_vGa_{(1-v)}N$ layer (0<v<1) can include different concentrations of dopants.

Growth of the second n-type semiconductor layer 133 includes introducing an Al source, a GaN source and an N source into the growth chamber, in which growth temperature can be set in the range of about 900° C. to about 1100° C. and at a growth pressure between 0 and 300 Torr within the growth chamber. During growth of the second n-type semiconductor layer 133, a flow rate of each of the Al source, the GaN source and the N source can be kept constant and the growth temperature can also be generally kept constant within allowable tolerance.

Furthermore, growth of the second n-type semiconductor layer 133 can include supplying the n-type dopant source into the growth chamber in the form of pulses. As shown in FIG. 3, the n-type dopant source can be supplied in the form of pulses, for example in the form of multiple pulses. Accordingly, during growth of the $Al_uGa_{(1-u)}N$ layer (0<u<1), when the n-type dopant source is supplied at a second flow rate, the $Al_uGa_{(1-u)}N$ layer (0<u<1) can be doped in a relatively high concentration. When the n-type dopant source is supplied at a first flow rate, the $Al_uGa_{(1-u)}N$ layer (0<u<1) can be doped in a relatively low concentration or can become an undoped layer. For example, the $Al_uGa_{(1-u)}N$ layer (0<u<1) can have an n-type dopant concentration of about $1\times10^{18}$ to about $1\times10^{19}/cm^3$.

In some implementations, the n-type dopant source can be supplied into the growth chamber in an asymmetrical way as shown in FIG. 4a, or in an irregular way.

In the second n-type semiconductor layer 133, a high impurity concentration layer and a low impurity concentration layer are alternately repeated, thereby suppressing deterioration in crystallinity of the semiconductor layers due to impurities. As a result, it is possible to improve crystallinity of other semiconductor layers grown by subsequent processes.

Figure 18:
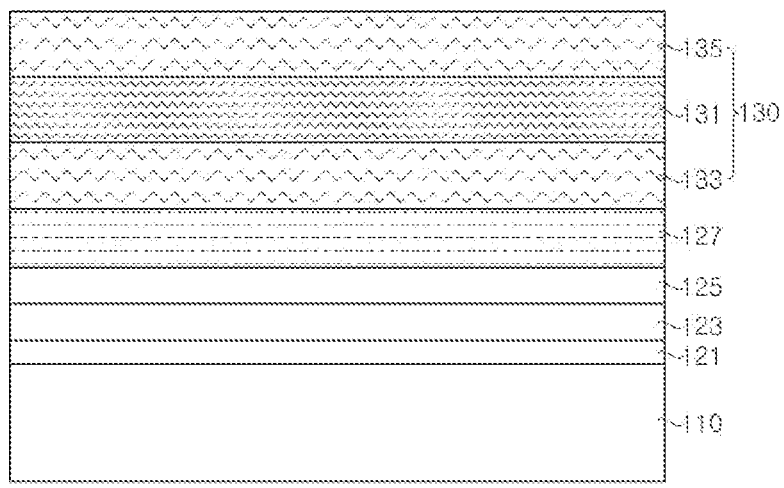

Then, referring to FIG. 18, a first n-type semiconductor layer 131 is grown on the second n-type semiconductor layer 133 and a third n-type nitride layer 135 is grown on the first n-type semiconductor layer 131, thereby forming an n-type semiconductor layer 130.

Growth of the first n-type semiconductor layer 131 according to this embodiment is generally similar to growth of the first n-type semiconductor layer 131 according to the embodiment described with reference to FIG. 1 to FIG. 10, and growth of the third n-type nitride layer 135 is generally similar to growth of the second n-type semiconductor layer 133.

In this embodiment, one of the second n-type semiconductor layer 133 and the third n-type nitride layer 135 can be omitted. The second n-type semiconductor layer 133 and/or the third n-type nitride layer 135 are formed before and/or after growth of the first n-type semiconductor layer 131, thereby improving crystallinity of the semiconductor layers in the light emitting diode. In addition, the second n-type semiconductor layer 133 and the third n-type nitride layer 135 acting as stress relief layers include n-type dopants, thereby preventing deterioration in electron injection efficiency by the stress relief layers.

Figure 19:
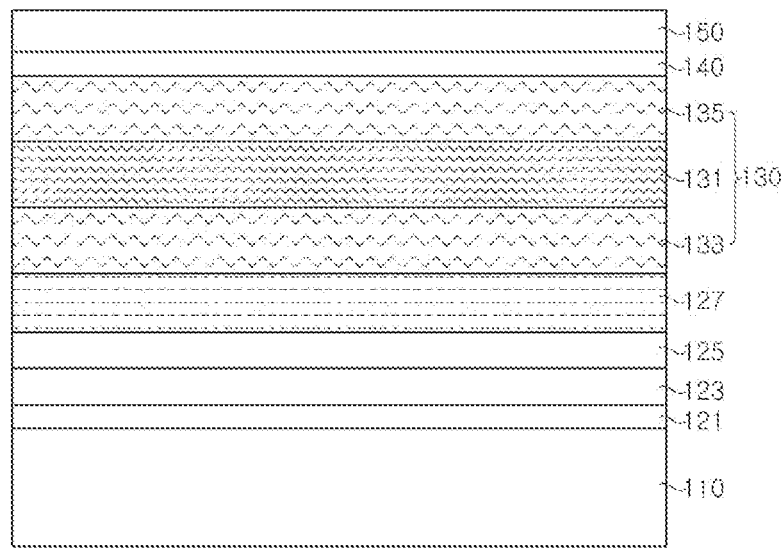

Then, referring to FIG. 19, an active layer 140 and a p-type semiconductor layer 150 are formed on the n-type semiconductor layer 130. Next, referring to FIG. 20, a support substrate 160 can be formed on the p-type semiconductor layer 150.

Figure 20:
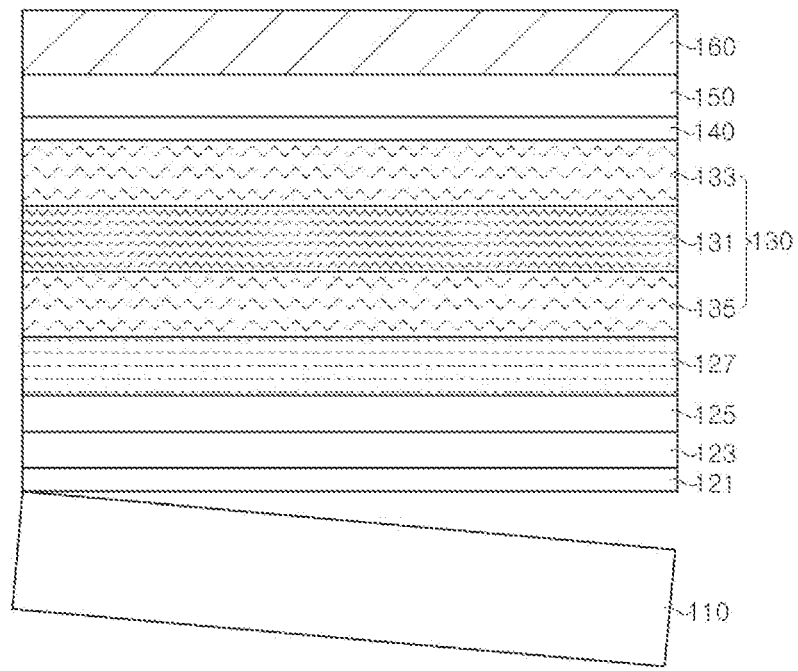

The processes shown in FIG. 19 and FIG. 20 are generally similar to the processes described with reference to FIG. 5 and FIG. 6, and detailed descriptions thereof will be omitted.

Figure 21:
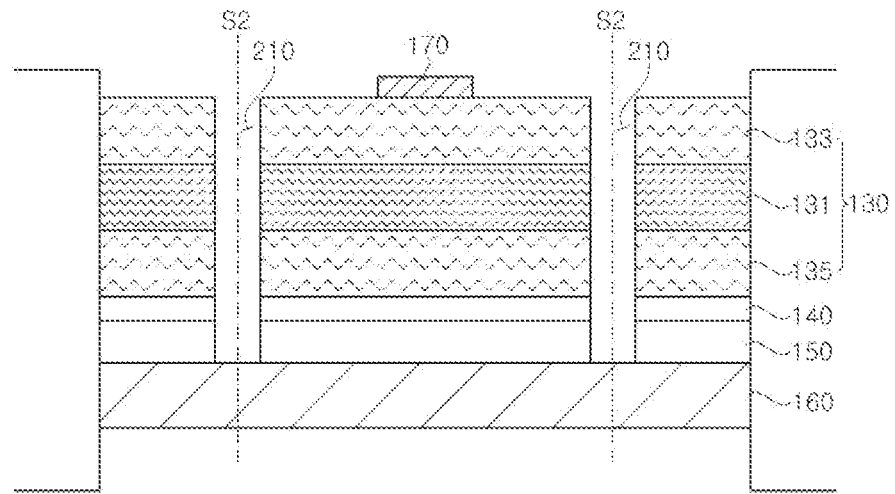

Referring to FIG. 21, device isolation trenches 210 can be formed by patterning the n-type semiconductor layer 130, the active layer 140 and the p-type semiconductor layer 150. By forming the device isolation trenches 210, an upper surface of the support substrate 160 can be partially exposed. In addition, an N-electrode 170 can be formed on each of device areas isolated from each other by the device isolation trench 210.

Patterning of the n-type semiconductor layer 130, the active layer 140 and the p-type semiconductor layer 150 can be performed by photolithography and etching, and the device isolation trenches 210 can be formed to have inclined side surfaces.

The N-electrode 170 can serve to supply external power to the n-type semiconductor layer 130 and can be formed by deposition and lift-off technology.

Figure 22:
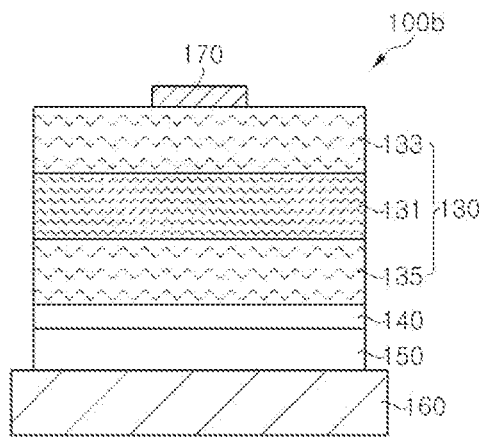
Figure 23A:
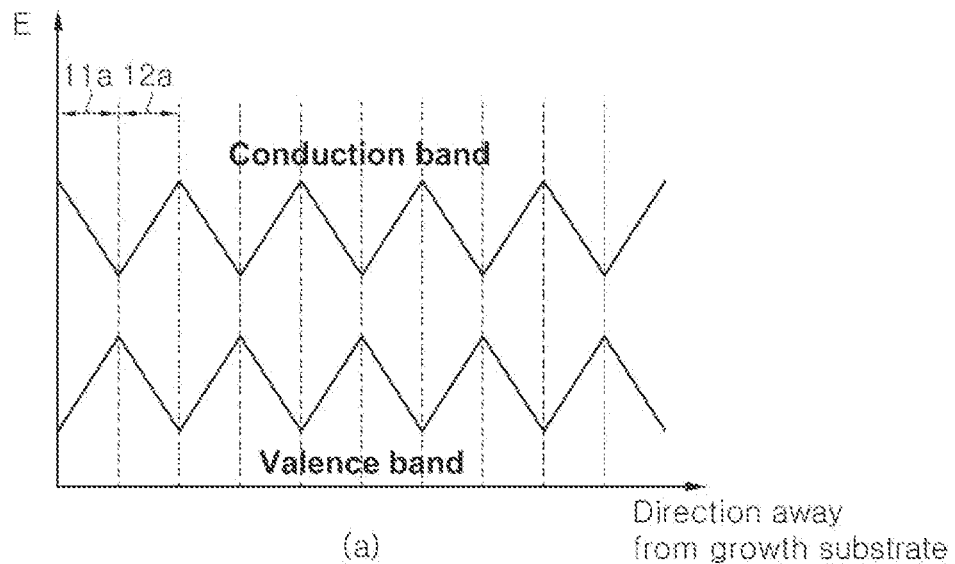
FIG. 23a to FIG. 24b are diagrams depicting change in band gap energy in a light emitting diode according to some embodiments of the disclosure.
Figure 23B:
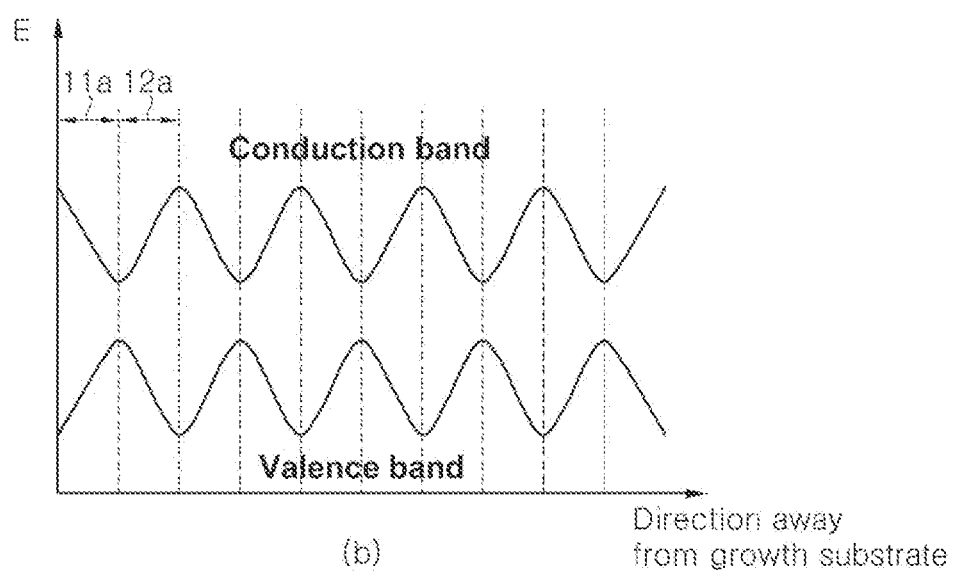
Figure 24A:
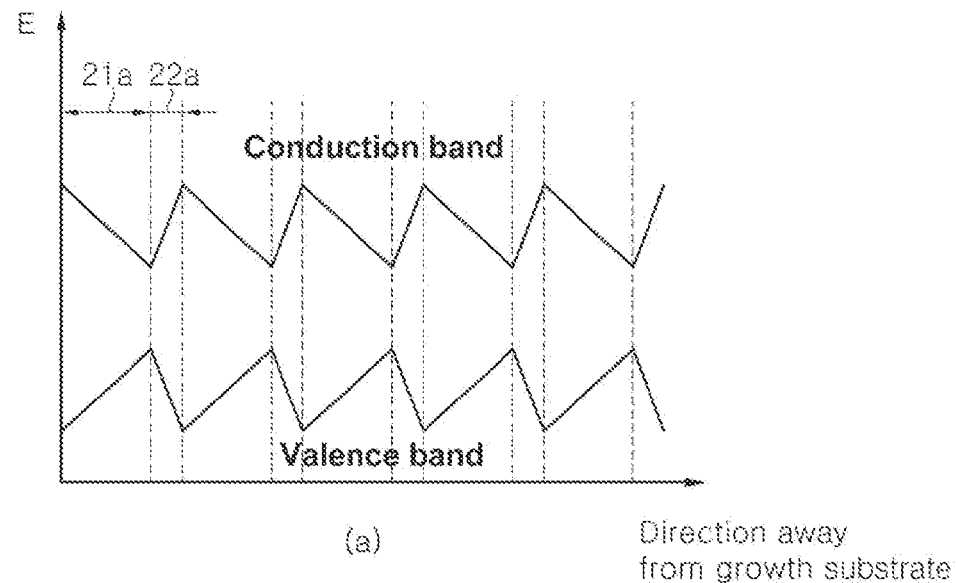
Figure 24B:
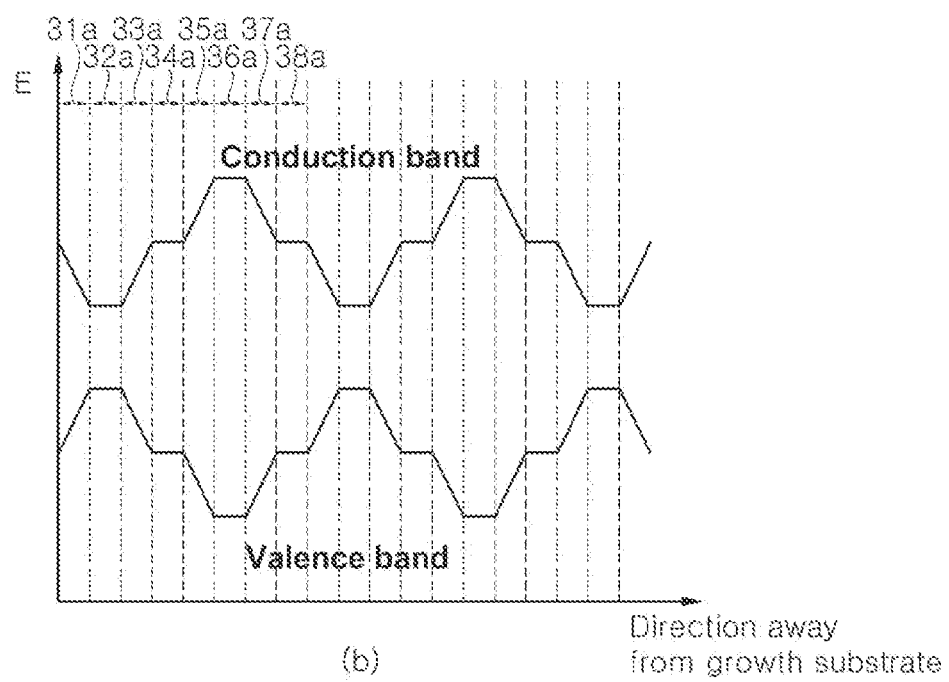

Thereafter, the support substrate 160 disposed under each of the device isolation trenches 210 is divided along line S1, thereby providing a UV light emitting diode 100b as shown in FIG. 22.

The light emitting diodes according to the aforementioned embodiments of the disclosure have superior crystallinity to typical light emitting diodes in the related art, and the growth substrate are removed from the semiconductor layers of the light emitting diodes, thereby securing excellent heat dissipation efficiency and luminous efficacy.

Although the above descriptions of the embodiments relate to a vertical type light emitting diode, from which the growth substrate 110 is removed, it should be understood that the present disclosure is not limited thereto and other implementations are also possible. The aforementioned fabrication methods can also be applied to a flip-chip type light emitting diode.

It should be understood that the present disclosure is not limited to the embodiments and features described above, and various modifications and changes can be made without departing from the spirit and scope of the present disclosure, as set forth in the following claims.

What is claimed is:

1. A method of fabricating a UV light emitting diode, comprising:
   forming an n-type semiconductor layer over a growth substrate within a growth chamber; and
   forming an active layer and a p-type semiconductor layer over the n-type semiconductor layer,
   wherein:
   the forming the n-type semiconductor layer includes growing a first n-type semiconductor layer including AlGaN,
   the growing the first n-type semiconductor layer includes changing a growth pressure within the growth chamber and changing a flow rate of an n-type dopant source introduced into the growth chamber,
   the changing the growth pressure during growth of the first n-type semiconductor layer includes performing at least one cycle of a pressure increasing period and a pressure decreasing period, and
   the changing the flow rate of the n-type dopant source includes increasing the flow rate of the n-type dopant source in a pulse form.

2. The method of fabricating a light emitting diode of claim 1, wherein the growing the first n-type semiconductor layer includes growing an $Al_xGa_{(1-x)}N$ layer (0<x<1) in the pressure increasing period and growing an $Al_yGa_{(1-y)}N$ layer (0<y<1) in the pressure decreasing period, and
   wherein x gradually decreases in a direction away from the growth substrate, and y gradually increases in the direction away from the growth substrate.

3. The method of fabricating a light emitting diode of claim 2, wherein the changing the growth pressure during growth of the first n-type semiconductor layer includes at least two cycles of the pressure increasing period and the pressure decreasing period.

4. The method of fabricating a light emitting diode of claim 2, wherein the changing the flow rate of the n-type dopant source includes supplying the n-type dopant source at a first flow rate during the pressure decreasing period and supplying the n-type dopant source at a second flow rate higher than the first flow rate during the pressure increasing period, and
   wherein the changing the flow rate of the n-type dopant source includes supplying the n-type dopant source in a pulse form.

5. The method of fabricating a light emitting diode of claim 4, wherein the changing the flow rate of the n-type dopant source includes supplying the n-type dopant source in a square waveform.

6. The method of fabricating a light emitting diode of claim 3, wherein the changing the growth pressure during growth of the first n-type semiconductor layer forms a triangular waveform or a harmonic waveform.

7. The method of fabricating a light emitting diode of claim 1, wherein the forming the n-type semiconductor layer further includes maintaining flow rates and growth temperature of Al, Ga and N sources within the growth chamber as constant.

8. The method of fabricating a light emitting diode of claim 1, further including, before the forming the n-type semiconductor layer:

forming a GaN layer;

forming an AlN layer on the GaN layer, wherein the forming the AlN layer includes supplying an Al source and an N source at constant flow rates into the growth chamber and changing pressure of the growth chamber from a first pressure to a second pressure and vice versa, and wherein the first pressure is different from the second pressure.

9. The method of fabricating a light emitting diode of claim 1, further including:

forming an undoped nitride layer before forming the n-type semiconductor layer.

10. The method of fabricating a light emitting diode of claim 9, wherein the forming the undoped nitride layer includes alternately stacking an $Al_wGa_{(1-w)}N$ layer (0<w<1) grown at a first pressure and an $Al_zGa_{(1-z)}N$ layer (0<z<1) grown at a second pressure, and wherein the first pressure is different from the second pressure.

11. The method of fabricating a light emitting diode of claim 9, wherein the forming the undoped nitride layer includes changing a growth pressure within the growth chamber over time, and the changing of the growth pressure during growth of the undoped nitride layer includes performing at least one cycle including a pressure increasing period and a pressure decreasing period.

12. The method of fabricating a light emitting diode of claim 1, wherein the forming the n-type semiconductor layer further includes forming at least one of a second n-type semiconductor layer and a third n-type nitride semiconductor layer over a lower surface and a upper surface of the first n-type semiconductor layer, respectively.

13. The method of fabricating a light emitting diode of claim 12, wherein the forming the second n-type semiconductor layer, the third n-type semiconductor layer, or both includes changing the flow rate of the n-type dopant source introduced into the growth chamber, and wherein the changing the flow rate of the n-type dopant source includes increasing the flow rate of the n-type dopant source in a pulse form.

14. The method of fabricating a light emitting diode of claim 1, wherein the changing the growth pressure during the growth of the first n-type semiconductor layer includes maintaining the growth pressure at a constant level during at least one pressure maintaining period.

15. The method of fabricating a light emitting diode of claim 8, wherein the forming the AlN layer includes forming the AlN layer having varying Al mole fractions depending on pressure condition under which the AlN layer is formed.

* * * * *